(12) United States Patent
Bae

(10) Patent No.: US 6,569,605 B1
(45) Date of Patent: May 27, 2003

(54) PHOTOMASK AND METHOD FOR FORMING MICRO PATTERNS OF SEMICONDUCTOR DEVICE USING THE SAME

(75) Inventor: Sang Man Bae, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/606,462

(22) Filed: Jun. 28, 2000

(30) Foreign Application Priority Data

Jun. 29, 1999 (KR) ............................. 99-25306

(51) Int. Cl.[7] ................................. G03C 5/00
(52) U.S. Cl. ................. 430/316; 430/312; 430/317; 430/330; 430/394; 430/318
(58) Field of Search .................. 430/311, 312, 430/313, 316, 318, 317, 330, 5, 394, 322, 323, 324

(56) References Cited

U.S. PATENT DOCUMENTS 5,583,069 A    12/1996  Ahn et al.
5,700,731 A    12/1997  Lin et al.
5,741,625 A  *  4/1998  Bae et al. .................... 430/312
6,005,295 A    12/1999  Hattori
6,015,650 A  *  1/2000  Bae ............................. 430/314

FOREIGN PATENT DOCUMENTS

| JP | 06177068 | 6/1994 |
| JP | 08248644 | 9/1996 |
| JP | 10335332 | 12/1998 |
| JP | 11065108 | 3/1999 |
| JP | 11214285 | 8/1999 |

* cited by examiner

Primary Examiner—Mark F. Huff
Assistant Examiner—Saleha R. Mohamedulla
(74) Attorney, Agent, or Firm—Pillsbury Winthrop LLP

(57) ABSTRACT

A photomask including chromium patterns divided into two groups in such a fashion that the chromium patterns in one of the two chromium pattern groups alternate, one by one, with the chromium patterns in the other chromium pattern group, the chromium patterns being formed on two quartz substrate for the two chromium pattern groups, respectively, to prepare for the photomask, two separate photomasks each having an increased space defined between adjacent chromium patterns thereof so as to avoid a severe diffraction of light passing between the adjacent chromium patterns. A method for forming micro patterns of a semiconductor device using the photomask is also disclosed.

9 Claims, 9 Drawing Sheets

PHOTOMASK AND METHOD FOR FORMING MICRO PATTERNS OF SEMICONDUCTOR DEVICE USING THE SAME

BACKGROUND OF THE INVENTION

1. Field of the Invention

The present invention relates to a method for fabricating a semiconductor device, and more particularly to a photomask for overcoming a limitation on the resolution of a stepper, and a method for forming micro patterns using the photomask.

2. Description of the Related Art

For light exposure machines such as steppers, those using a light source of a shorter wavelength have conventionally been used in order to obtain a reduced pattern size. For instance, light sources of G-line ($\lambda$=435 nm) or I-line ($\lambda$=365 nm) have mainly been used. Recently, light sources of KrF ($\lambda$=248 nm) or ArF ($\lambda$=193 nm) have been proposed. Also, a light exposure process using X-rays has been proposed.

However, there is a limitation in obtaining a desired reduction in pattern size, only with a light source of a short wavelength. In order to solve such a problem, accordingly, there have also been proposed a modified illumination process and a light exposure process using two sheets of photomasks. The light exposure process using two sheets of photomasks is disclosed in Japanese Patent No. 58-127325 (published on Jul. 29, 1983) and U.S. Pat. No. 5,503,959 (issued on Apr. 2, 1996).

Hereinafter, a typical photomask, a double photomask consisting of two photomask sheets and light exposure processes respectively using those photomasks will be described in conjunction with FIGS. 1 and 2.

FIG. 1 is a schematic view illustrating a typical photomask having chromium patterns of a high density, and an intensity distribution of light exhibited in a light exposure process using the photomask. FIG. 2 is a schematic view illustrating a double photomask consisting of two photomask sheets each having a chromium pattern of low density, and an intensity distribution of light exhibited in a light exposure process using the double photomask. In FIGS. 1 and 2, the reference numeral 1 denotes a quartz substrate, the reference numbers 2, 12a, and 12b denote chromium patterns, respectively, the reference numerals 3, 13a, 13b denote spaces, respectively, and the reference numerals 10, 20a, and 20b denote photomasks, respectively.

In the case of the typical photomask 10, its fabrication is difficult because the chromium patterns 2 are formed in a high density on the quartz substrate 1, as shown in FIG. 1. Where a light exposure is conducted using this photomask 10, light passing through the space 3 may be subjected to a severe diffraction because the space 3 has a small width $d_1$. For this reason, it is difficult to form micro line/space patterns.

Meanwhile, in the case of the double photomask consisting of two photomasks 20a and 20b, as shown in FIG. 2, its fabrication is easy, as compared to the typical photomask 10. This is because the chromium patterns 12a and 12b of the photomasks 20a and 20b have low density.

In the case of the double photomask, however, light passing through the spaces 13a and 13b may also be subjected to a severe diffraction because the spaces 13a and 13b have the same width, $d_2$, as the width $d_1$ of the space 3 in the typical photomask 10. For this reason, it is difficult to form micro line/space patterns even though the photomasks 20a and 20b are used.

For instance, where a light exposure is conducted using the above mentioned two photomask sheets in order to fabricate a highly dense memory device such as a 256-Mega DRAM or a 1-Giga DRAM, the respective pattern shapes of the chromium patterns 12a and 12b are insufficiently transferred to a photoresist film, formed therebeneath, due to a severe diffraction phenomenon of light. As a result, it is impossible to obtain micro line/space patterns.

Furthermore, although typical light exposure processes are conducted using a positive photoresist film, the light exposure process using the above mentioned two photomask sheets is conducted using a negative photoresist film. Such a use of the negative photoresist film results in a requirement to construct a new process line. For this reason, a separate management is required.

SUMMARY OF THE INVENTION

Therefore, an object of the invention is to provide a photomask capable of solving problems resulting from a severe diffraction phenomenon of light.

Another object of the invention is to provide a method for forming micro patterns of a semiconductor device using the photomask adapted to the above mentioned object of the present invention.

In accordance with one aspect, the present invention provides a photomask comprising: a first photomask consisting of a first quartz substrate and first chromium patterns formed on the first quartz substrate; and a second photomask consisting of a second quartz substrate and second chromium patterns formed on the second quartz substrate, wherein chromium patterns divided into two groups respectively consisting of the first chromium patterns and the second chromium patterns in such a fashion that a space defined between adjacent ones of the first or second chromium patterns is more than a space defined between adjacent ones of the first and second chromium patterns so as to avoid a severe diffraction of light passing between adjacent ones of the chromium patterns.

In accordance with one aspect, the present invention provides a method for forming micro patterns of a semiconductor device using a photomask including chromium patterns divided into two groups in such a fashion that the chromium patterns in one of the two chromium pattern groups alternate, one by one, with the chromium patterns in the other chromium pattern group, the chromium patterns being formed on two quartz substrates for the two chromium pattern groups, respectively, to prepare, for the photomask, two separate photomasks each having an increased space defined between adjacent chromium patterns thereof so as to avoid a severe diffraction of light passing between the adjacent chromium patterns, comprising the steps of: preparing a silicon substrate sequentially formed with an etch target layer, an etch barrier layer, and a first photoresist film over an upper surface thereof; exposing the first photoresist film to light by use of a first one of the photomasks, and subjecting the light-exposed first photoresist film to a development process, thereby forming first photoresist film pattern; etching the etch barrier layer, by use of the first photoresist film patterns as a mask, to partially expose the etch target layer; coating a second photoresist film over the resulting structure; exposing the second photoresist film to light by use of a second one of the photomasks, and subjecting the light-exposed second photoresist film to a development process, thereby forming second photoresist film patterns on portions of the etch target layer exposed between adjacent etched portions of the etch barrier layer, respectively; etching the etch target layer by use of the second photoresist film patterns and the etch barrier layer as a mask; and removing the remaining etch barrier layer and the second photoresist film pattern.

In accordance with still another aspect, the present invention provides a method for forming micro patterns of a semiconductor device using a photomask including chromium patterns divided into two groups in such a fashion that the chromium patterns in one of the two chromium pattern groups alternate, one by one, with the chromium patterns in the other chromium pattern group, the chromium patterns being formed on two quartz substrates for the two chromium pattern groups, respectively, to prepare, for the photomask, two separate photomasks each having an increased space defined between adjacent chromium patterns thereof so as to avoid a severe diffraction of light passing between the adjacent chromium patterns, comprising the steps of: preparing a silicon substrate sequentially formed with an etch target layer, a first photoresist film, an etch barrier layer, and a second photoresist film over an upper surface thereof; exposing the second photoresist film to light by use of a first one of the photomasks, and subjecting the light-exposed second photoresist film to a development process, thereby forming second photoresist film patterns; etching exposed portions of the etch barrier layer to a desired depth by use of the second photoresist film patterns as a mask in such a fashion that the etch barrier layer has portions of different thicknesses; coating a third photoresist film over the resulting structure; exposing the third photoresist film to light by use of a second one of the photomasks, and subjecting the light-exposed third photoresist film to a development process, thereby forming third photoresist film patterns on portions of the etch barrier layer exposed between adjacent ones of the second photoresist film patterns, respectively; etching exposed portions of the etch barrier layer by use of the second and third photoresist film patterns as a mask; etching the first photoresist film by use of a second and third photoresist film patterns as a mask; removing the second and third photoresist film patterns; etching the etch target layer by use of the etch barrier layer and the first photoresist film patterns as a mask; and removing the remaining etch barrier layer and the first photoresist film pattern.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF THE INVENTION

Figure 3A:
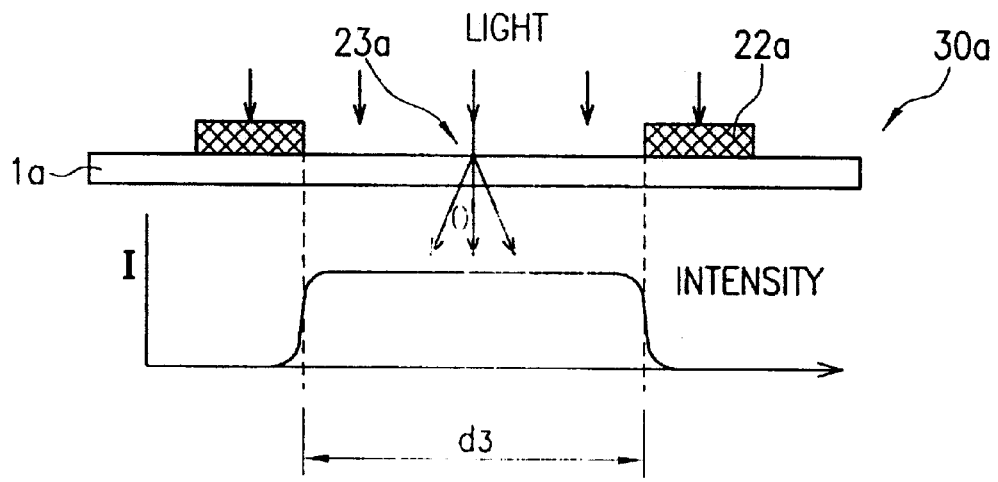
FIGS. 3A and 3B are schematic views respectively illustrating photomasks of a double photomasks according to an embodiment of the present invention, and respective intensity distributions of light exhibited in a light exposure process conducted using the photomasks.
Figure 3B:
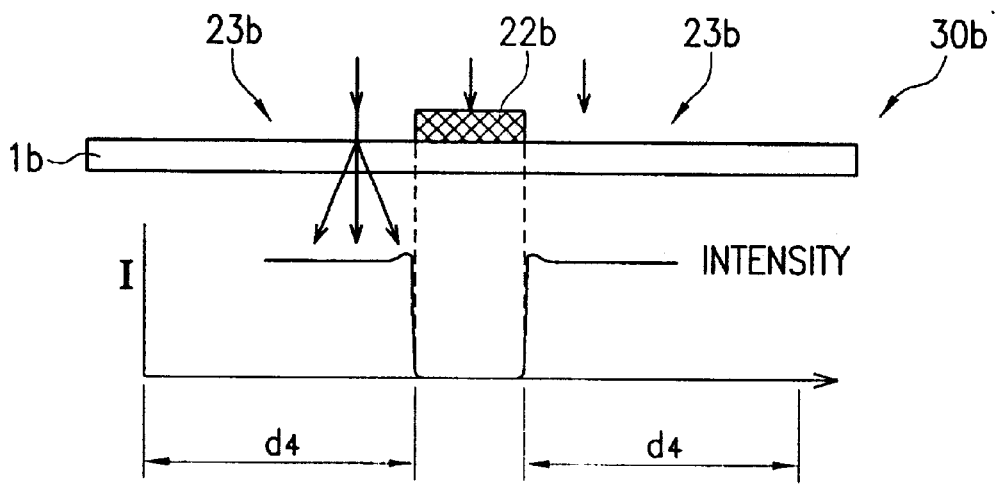

FIGS. 3A and 3B are schematic views respectively illustrating photomasks of a double photomask according to an embodiment of the present invention, and respective intensity distributions of light exhibited in a light exposure process conducted using the photomasks.

Figure 1:
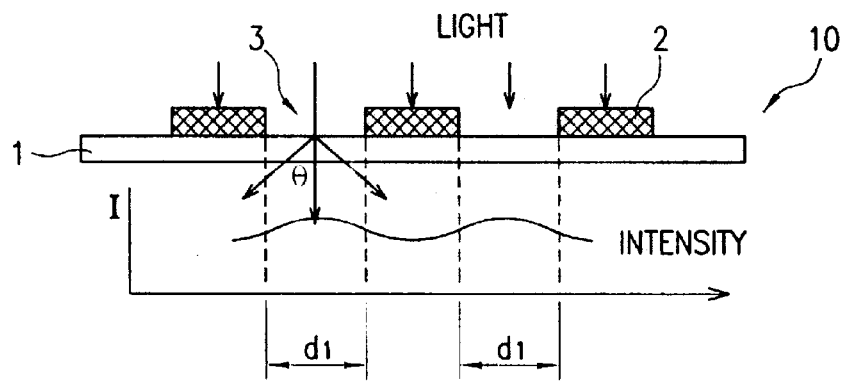
FIG. 1 is a schematic view illustrating a typical photomask having chromium patterns of a high density, and an intensity distribution of light exhibited in a light exposure process using the photomask.
Figure 2:
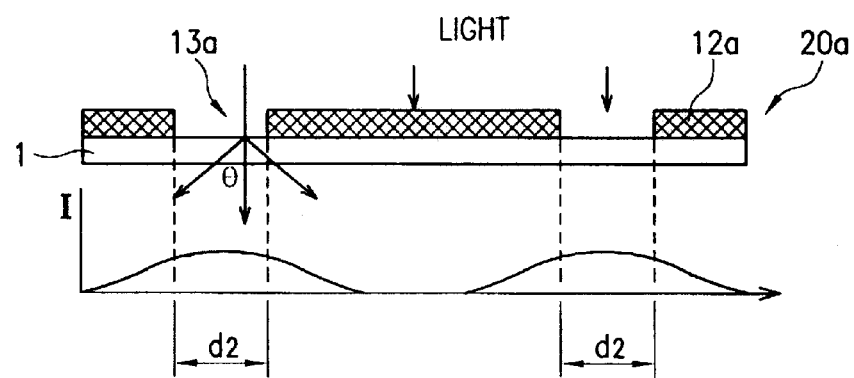
FIG. 2 is a schematic view illustrating a double photomask consisting of two photomask sheets each having chromium patterns of a low density, and an intensity distribution of light exhibited in a light exposure process using the double photomask.
Figure 2:
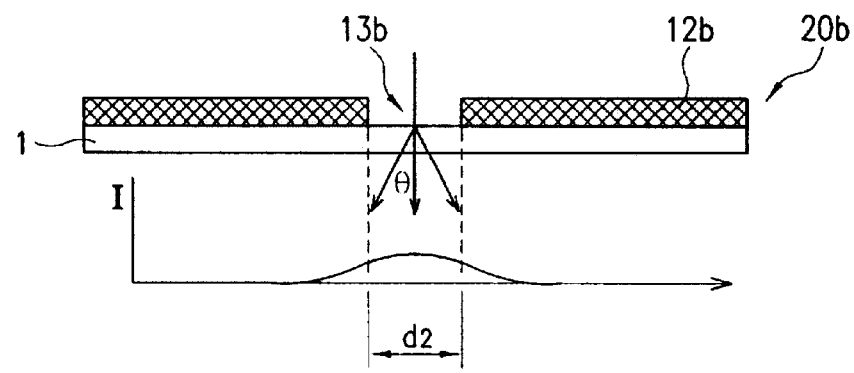

As shown FIGS. 3A and 3B, the double photomask according to the illustrated embodiment of the present invention includes a first photomask 30a consisting of a first quartz substrate 1a, and first chromium patterns 22a formed on the upper surface of the first quartz substrate 1a, and a second photomask 30b consisting of a second quartz substrate 1b, and second chromium patterns 22b formed on the upper surface of the second quartz substrate 1b. The first and second chromium patterns 22a and 22b of the first and second photomasks 30a and 30b correspond to first and second groups of chromium patterns in a typical photomask 10 shown in FIG. 1. In the typical photomask 10, the chromium patterns of the first group are arranged in an alternating fashion with respect to those of the second group. That is, when viewed in a plan view illustrating the layout of the double photomask, the first chromium patterns 22a of the first photomask 30a are arranged in an alternating fashion with respect to the second chromium patterns 22b of the second photomask 30b. By such an arrangement, the width $d_3$ of the space 23a defined between neighboring ones of the first chromium patterns 22a or a width $d_4$ of a space 23b defined between neighboring ones of the second chromium patterns 22b is increased, as compared to the width $d_1$ of the space 3 defined in the typical photomask 10.

Where a light exposure process is conducted using the photomasks 30a and 30b, light passing between adjacent ones of the chromium patterns of each of the photomasks is not subjected to a severe diffraction because the space of neighboring chromium patterns in each photomask is large. For this reason, there is a reduced adverse effect resulting from a diffraction phenomenon of the light passing though the photomasks. Thus, it is possible to form micro line/space patterns.

FIGS. 4A to 4F are cross-sectional views respectively illustrating sequential processing steps of a method for forming micro patterns using the above mentioned double photomask in accordance with an embodiment of the present invention.

Figure 4A:
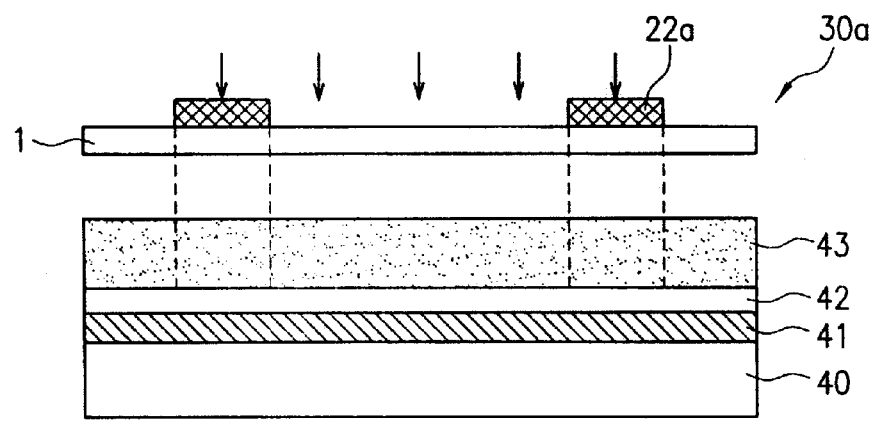
FIGS. 4A to 4F are cross-sectional views respectively illustrating sequential processing steps of a method for forming micro patterns using the double photomask in accordance with an embodiment of the present invention.

In accordance with the illustrated method, a silicon substrate 40 is first prepared which is formed with a conductive layer 41, as shown in FIG. 4A. An etch barrier layer 42 is then formed over the conductive layer 41. A first photoresist film 43 is then coated over the etch barrier layer 42.

Preferably, the etch barrier layer 42 is made of an organic film or a TiN oxide film. The first photoresist film 43 is of a positive type. The first photoresist film 43 is exposed to light in accordance with a light exposure process using the first photomask 30a.

Figure 4B:
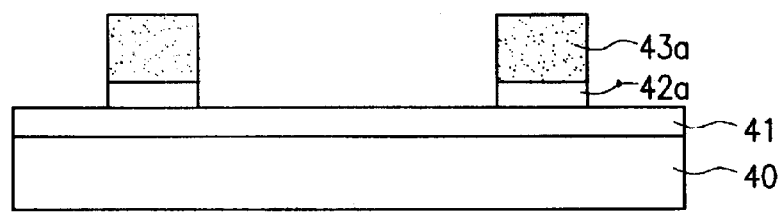

Referring to FIG. 4B, the first photoresist film 43 is then subjected to a development process, thereby forming first photoresist film patterns 43a corresponding to the remaining portions of the first photoresist film 43 not exposed to light. Using the first photoresist film patterns 43a as a mask, an etch process is carried out for the etch barrier layer 42, thereby forming etch barrier layer patterns 42a.

Figure 4C:
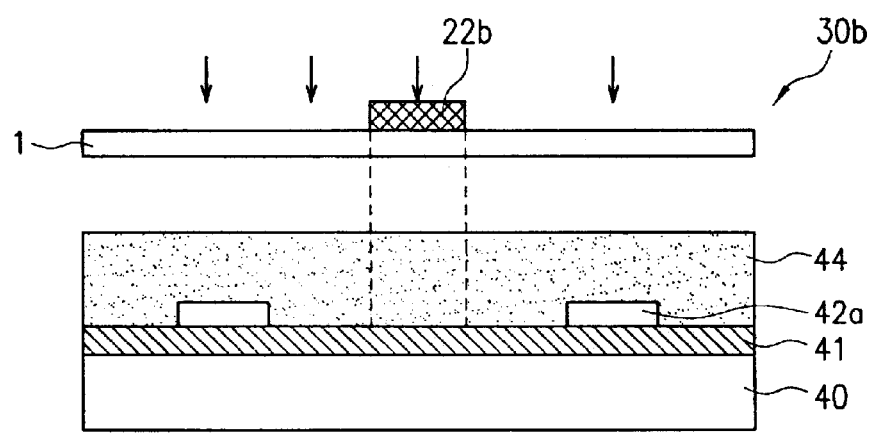

Thereafter, the first photoresist film patterns 43a are completely removed, as shown in FIG. 4C. Subsequently, a second photoresist film 44 is coated over the etch barrier layer patterns 42a and the conductive layer 41. The second photoresist film 44 is then exposed to light in accordance with a light exposure process using the second photomask 30b. The coating of the second photoresist film 44 may be carried out under the condition in which the first photoresist film patterns 43a still remain. In this case, an additional baking process is conducted for the first photoresist film patterns 43a in order to prevent the first photoresist film patterns 43a from being collapsed during a subsequent process. The baking process is carried out for one or two minutes at a temperature of 150 to 300° C.

Figure 4D:
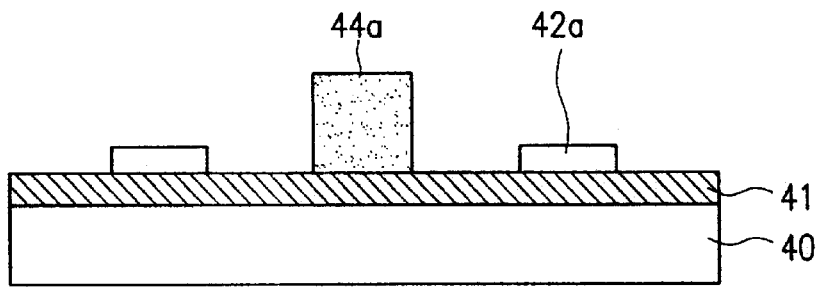

Referring to FIG. 4D, the second photoresist film 44 is then subjected to a development process, thereby forming second photoresist film patterns 44a corresponding to the remaining portions of the second photoresist film 44 not exposed to light.

Figure 4E:
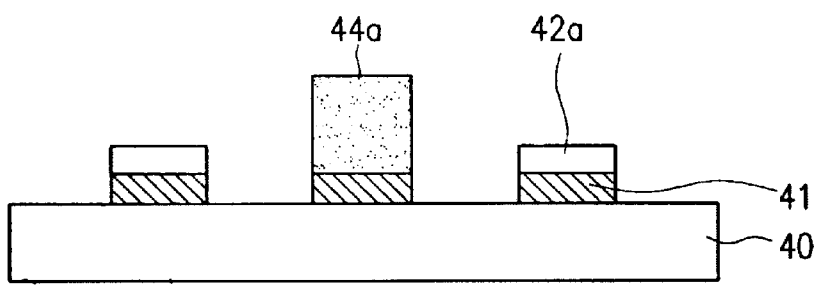
Figure 4F:
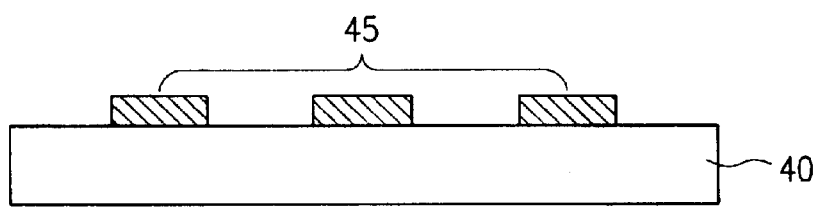

Thereafter, the conductive layer 41 is etched in accordance with an etch process using the etch barrier layer patterns 42a and second photoresist film patterns 44a as a mask, as shown in FIGS. 4E and 4F. The etch barrier layer patterns 42a and second photoresist film patterns 44a are then completely removed. Thus, line/space patterns 45 are finally obtained.

In accordance with the illustrated embodiment, it is possible to reduce an adverse effect resulting from a diffraction phenomenon of light because the light exposure for the photoresist films 43 and 44 are carried out using the photomasks 30a and 30b respectively having chromium patterns 22a and 22b of a low density. Therefore, respective pattern shapes of the chromium patterns 22a and 22b are transferred to the photoresist films 43 and 44 as they are. Thus, desired micro line/space patterns can be formed.

FIGS. 5A to 5G are cross-sectional views respectively illustrating sequential processing steps of a method for forming micro patterns using the above mentioned double photomask in accordance with another embodiment of the present invention.

Figure 5A:
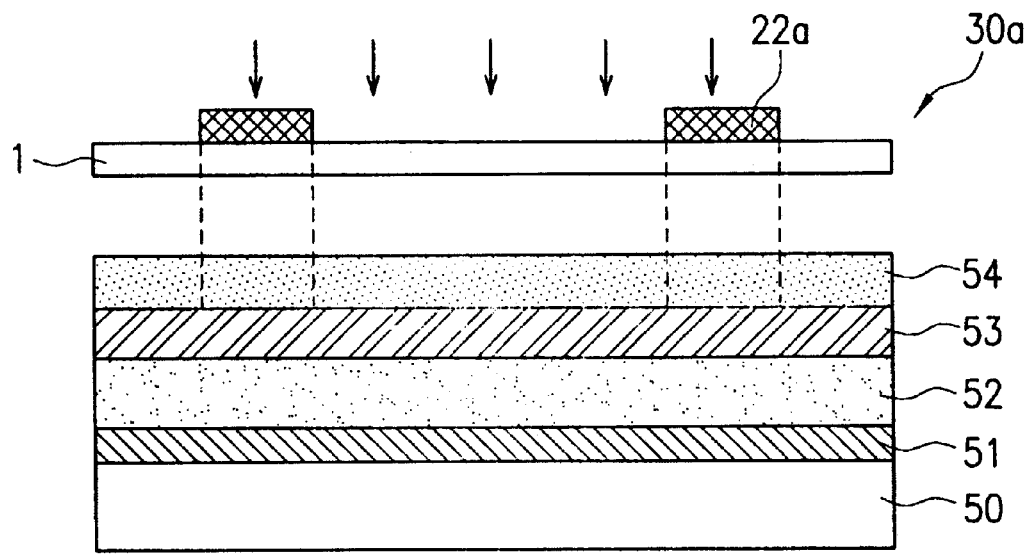
FIGS. 5A to 5G are cross-sectional views respectively illustrating sequential processing steps of a method for forming micro patterns using the double photomask in accordance with another embodiment of the present invention.

In accordance with the illustrated method, a silicon substrate 50 is first prepared which is formed with a conductive layer 51, as shown in FIG. 5A. Thereafter, a first photoresist film 52, an etch barrier layer 53, a second photoresist film 54 are sequentially formed over the conductive layer 51. Preferably, the etch barrier layer 53 is made of an SOG film or a PE-oxide film. Alternatively, an organic or inorganic layer may be interposed between the etch barrier layer 53 and the second photoresist film 54. The second photoresist film 54 is then subjected to a light exposure process using the first photoresist mask 30a.

Figure 5B:
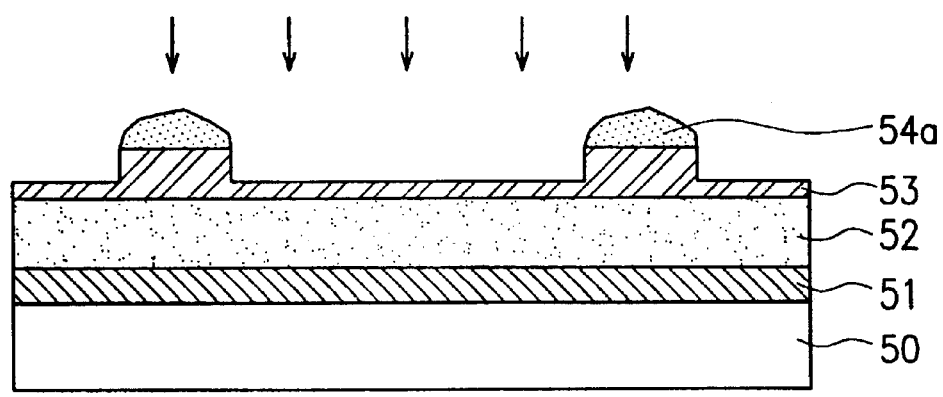

Referring to FIG. 5B, second photoresist film patterns 54a are then formed by developing the light-exposed second photoresist film 54. Subsequently, the etch barrier layer 53 is partially removed to a desired depth in accordance with an etch process using the second photoresist film patterns 54a as a mask. At this time, the second photoresist film patterns 54a are also partially etched during the etching of the etch barrier layer 53.

Figure 5C:
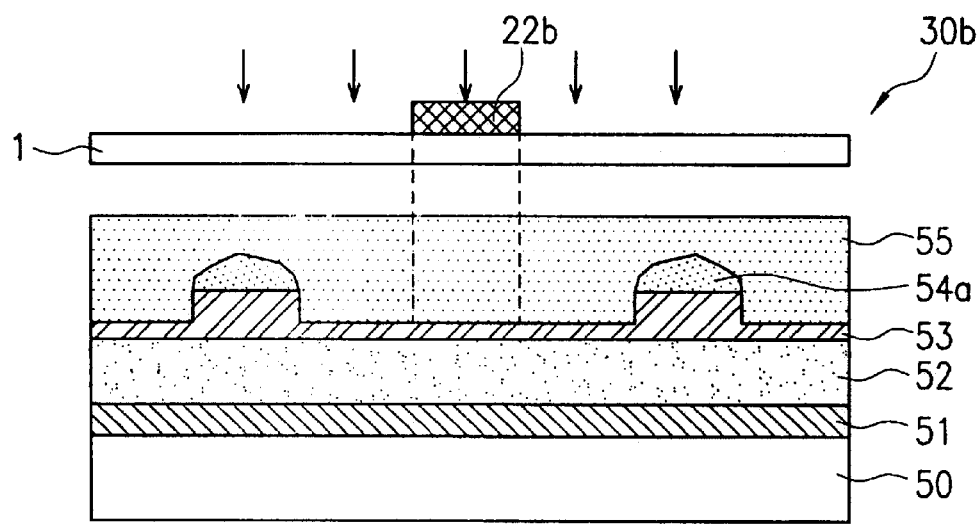

A third photoresist film 55 is then coated over the second photoresist film patterns 54a and the partially-etched etch barrier layer 53, as shown in FIG. 5C. The third photoresist film 55 is then subjected to a light exposure process using the second photomask 30b. In order to prevent the second photoresist film patterns 54a from being collapsed, a baking process is conducted at a temperature of 150 to 300° C. for 1 to 2 minutes prior to the coating of the third photoresist film 55.

Figure 5D:
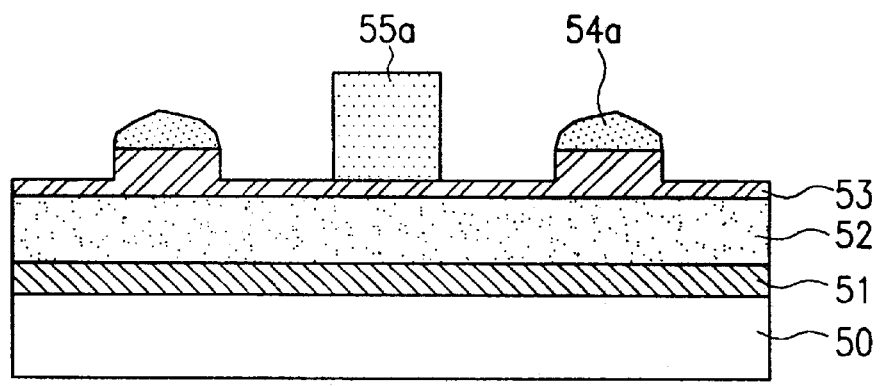

Referring to FIG. 5D, the light-exposed third photoresist film 55 is then subjected to a development process, thereby forming third photoresist film patterns 55a. The third photoresist film patterns 55a are arranged on the respective portions of the etch barrier layer 53 etched to a desired depth.

Figure 5E:
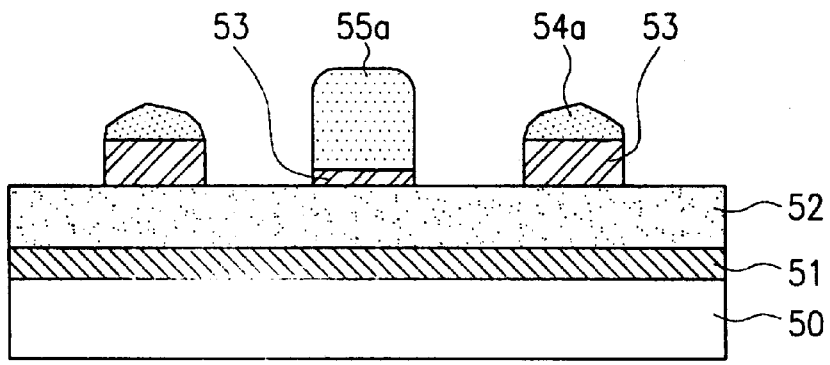

Subsequently, the etch barrier layer 53 is etched in accordance with a reactive ion etch (RIE) process using the third and second photoresist film patterns 55a and 54a as a mask, as shown in FIG. 5E. At this time, the etch barrier layer 53 is left while having different thicknesses at portions thereof respectively arranged beneath the third photoresist film patterns 55a and the second photoresist film patterns 54a because it has already been partially etched at the previous processing step.

Figure 5F:
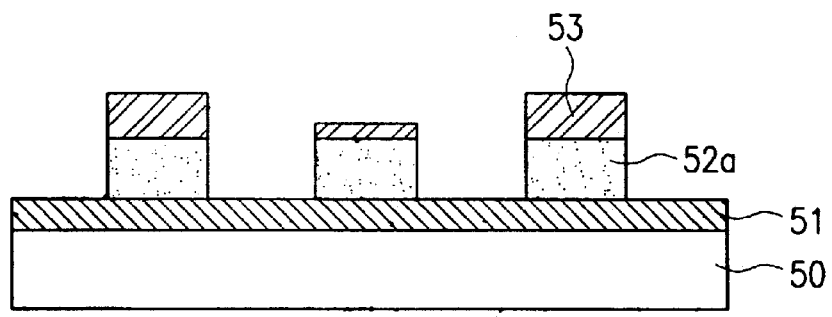
Figure 5G:
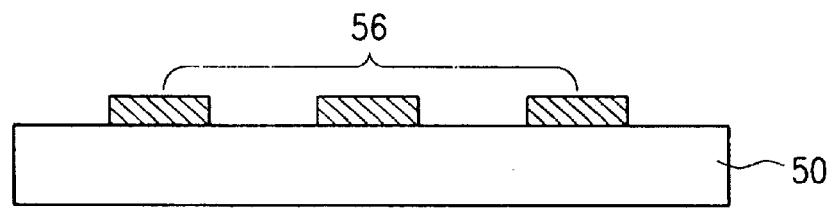

Referring to FIG. 5F, first photoresist film patterns 52a are then formed by etching the first photoresist film 52 in accordance with an etch process using the third and second photoresist film patterns 55a and 54a and the remaining etch barrier layer 53 as a mask. Preferably, the etch process is a dry etch process using $O_2$ plasma. During the etch process, the second photoresist film patterns 54a on the etch barrier layer 53 are completely removed. Also, where there is an organic or inorganic layer interposed between the etch barrier layer 53 and the second photoresist film patterns 54a, this organic or inorganic layer is removed.

Subsequently, the conductive layer 51 is etched in accordance with an etch process using the first photoresist film patterns 52a and etch barrier layer 53 as a mask. Thus, micro line/space patterns 56 are finally obtained. During the etch process, the etch barrier layer 53 is removed. If the etch barrier layer 53 is incompletely removed, it is then completely removed in a subsequent etch process.

In accordance with this embodiment, it is possible to reduce an averse effect resulting from a diffraction phenomenon of light because the light exposure for the third and second photoresist films 55 and 54 are carried out using the photomasks 30a and 30b respectively having chromium patterns 22a and 22b of a low density. Therefore, respective pattern shapes of the chromium patterns 22a and 22b are transferred to the photoresist films 43 and 44 as they are. Thus, desired micro line/space patterns can be formed.

Figure 6A:
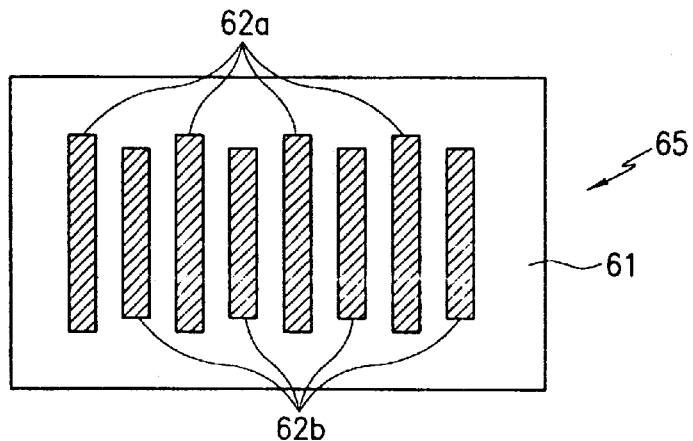
FIGS. 6A to 6C are plan views respectively illustrating a photomask used in the manufacture of a general DRAM, and two sheets of photomasks separately fabricated to form the photomask.
Figure 6B:
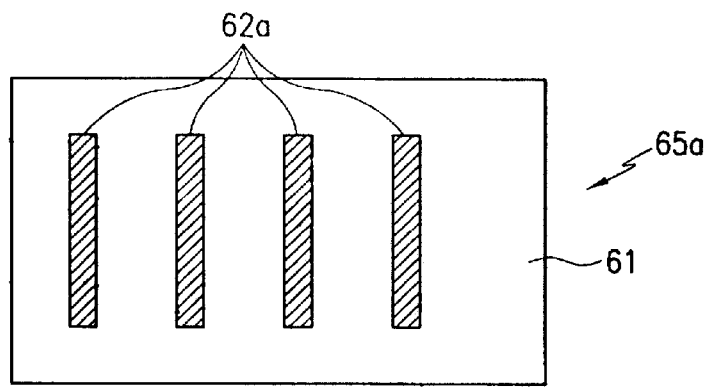
Figure 6C:
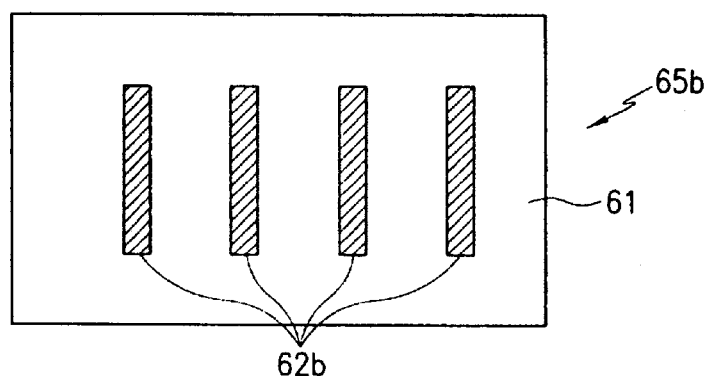

FIGS. 6A to 6C are plan views respectively illustrating a photomask used in manufacture of a general DRAM, an two sheets of photomasks separately fabricated to form the photomask. Referring to FIG. 6A, a photomask 65 is illustrated in which regular chromium patterns are arranged. The chromium patterns may be divided in two groups in such a fashion that the chromium patterns of the first group, that is, the chromium patterns 62a, are arranged in alternating fashion with respect to the chromium patterns of the second group, that is, the chromium patterns 62b, as shown in FIG.

6A. In accordance with the present invention, two separate photomasks 65a and 65b are fabricated which have the chromium patterns 62a of the first group and the chromium patterns 62b of the second group, respectively, as shown in FIGS. 6B and 6C. In FIGS. 6A to 6C, the reference numeral 61 denotes a quartz substrate.

Figure 7A:
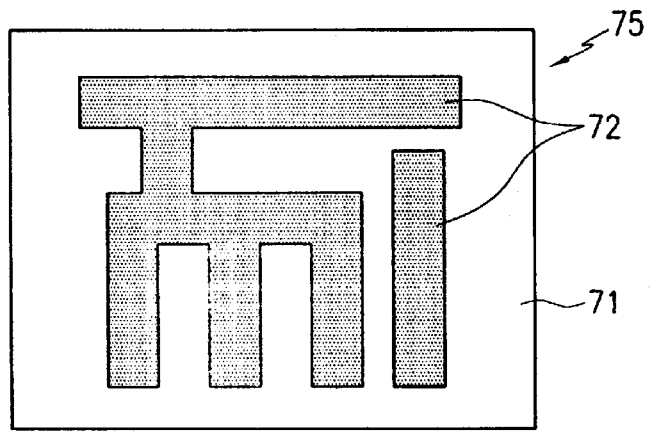
FIGS. 7A to 7C are plan views respectively illustrating a photomask used in the manufacture of a particular DRAM and ASIC, and two sheets of photomasks separately fabricated to form the photomask.
Figure 7B:
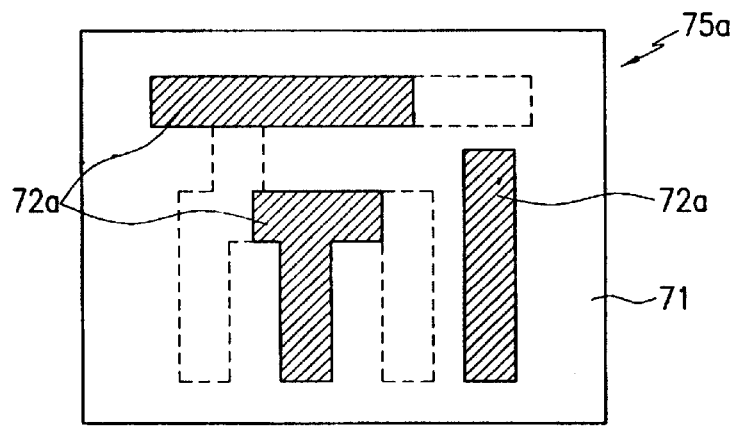
Figure 7C:
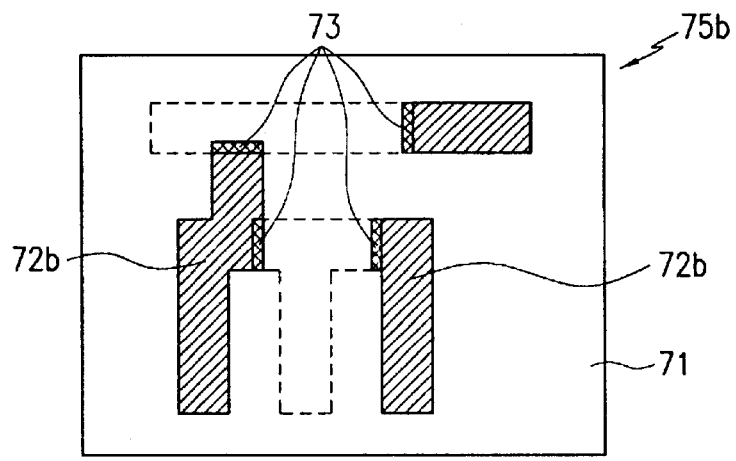

FIGS. 7A to 7C are plan views respectively illustrating a photomask used in manufacture of a particular DRAM and ASIC, an two sheets of photomasks separately fabricated to form the photomask. Referring to FIG. 7A, a photomask 75 is illustrated in which irregular chromium patterns 72 are arranged. The chromium patterns may be optionally divided into two groups in such a fashion that the chromium patterns of the first group, that is, the chromium patterns 72a, are arranged in alternating fashion with respect to the chromium patterns of the second group, that is, the chromium patterns 72b, as shown in FIG. 7B and 7C. In accordance with the present invention, two separate photomasks 75a and 75b are fabricated which have the chromium patterns 72a of the first group and the chromium patterns 72b of the second group, respectively, as shown in FIGS. 7B and 7C. In this case, each chromium pattern 72a or 72b of one group overlaps, at a region 73, with chromium patterns 72b or 72a of the other group arranged in an alternating fashion with respect to the chromium pattern 72a or 72b of the one group. Preferably, the overlapping width between the overlapping chromium patterns 72a and 72b at each overlapping region 73 is not more that half the line width of the chromium patterns. In FIGS. 7A to 7C, the reference numeral 71 denotes a quartz substrate.

As apparent from the above description, the present invention provides a double photomask including photomasks each having mask patterns of low density and an increased space width. Where a light exposure process is conducted using such photomask, it is possible to considerably reduce adverse effects resulting from a diffraction phenomenon of light. This makes it possible to form micro line/space patterns. Therefore, manufacture of highly integrated semiconductor devices is possible. Furthermore, a maximized efficiency of machines used can be obtained in that the existing stepper can be used as it is.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming micro patterns of a semiconductor device using a photomask including chromium patterns divided into two groups in such a fashion that the chromium patterns in one of the two chromium pattern groups alternate, one by one, with the chromium patterns in the other chromium pattern group, the chromium patterns being formed on two quartz substrate for the two chromium pattern groups, respectively, to prepare for the photomask, two separate photomasks each having an increased space defined between adjacent chromium patterns thereof so as to avoid a severe diffraction of light passing between the adjacent chromium patterns, comprising:

preparing a silicon substrate sequentially formed with an etch target layer, an etch barrier layer, and a first photoresist film over an upper surface thereof;

exposing the first photoresist film to light by use of a first one of the photomasks, and subjecting the light-exposed first photoresist film to a development process, thereby forming first photoresist film patterns;

etching the etch barrier layer, by use of the first photoresist film patterns as a mask, to partially expose the etch target layer;

baking the first photoresist film patterns;

coating a second photoresist film over the resulting structure;

exposing the second photoresist film to light by use of a second one of the photomasks, an subjecting the light-exposed second photoresist film to a development process, thereby forming second photoresist film patterns on portions of the etch target layer exposed between adjacent etched portions of the etch barrier layer, respectively;

etching the etch target layer by use of the second photoresist film patterns and the etch barrier layer as a mask; and removing the remaining etch barrier layer and the second photoresist, wherein the step of baking the first photoresist film patterns is performed between the step of etching the etch barrier layer and the step of coating the second photoresist film pattern.

2. The method according to claim 1, wherein the etch barrier layer is one selected from the group consisting of an organic film and a TiN oxide film.

3. The method according to claim 1, wherein the baking is carried out at a temperature of 150 to 300° C. for 1 to 2 minutes.

4. The method according to claim 1, further comprising the step of removing the first photoresist film pattern between the step of etching the etch barrier layer and the step of coating the second photoresist film.

5. A method for forming micro patterns of a semiconductor device using a photomask including chromium patterns divided into two groups in such a fashion that the chromium patterns in one of the two chromium pattern groups alternate, one by one, with the chromium patterns in the other chromium pattern group, the chromium patterns being formed on two quartz substrate for the two chromium pattern groups, respectively, to prepare for the photomask, two separate photomasks each having an increased space defined between adjacent chromium patterns thereof so as to avoid a severe diffraction of light passing between the adjacent chromium patterns, comprising:

preparing a silicon substrate sequentially formed with an etch target layer, a first photoresist film, an etch barrier layer, and a second photoresist film over an upper surface thereof;

exposing the second photoresist film to light by use of a first one of photomasks, and subjecting the light-exposed second photoresist film to a development process, thereby forming second photoresist film patterns;

etching exposed portions of the etch barrier layer to a desired depth by use of the second photoresist film patterns as a mask in such a fashion that the etch barrier layer has portions of different thicknesses;

coating a third photoresist film over the resulting structure;

exposing the third photoresist film to light by use of a second one of the photomasks, an subjecting the light-exposed third photoresist film to a development process, thereby forming third photoresist film patterns on portions of the etch barrier layer exposed between adjacent ones of the second photoresist film patterns, respectively;

etching exposed portions of the etch barrier layer by use of the second and third photoresist film patterns as a mask;

etching the first photoresist film by use of the second and third photoresist film patterns as a mask, thereby forming first photoresist film patterns;

removing the second and third photoresist film patterns;

etching the etch target layer by use of the etch barrier layer and the first photoresist film patterns as a mask; and removing the remaining etch barrier layer and the first photoresist film patterns.

6. The method according to claim 5, wherein the etch barrier layer is one selected from the group consisting of an SOG film and a PE-oxide film.

7. The method according to claim 5, wherein an organic or inorganic layer is interposed between the etch barrier layer and the second photoresist film.

8. The method according to claim 5, further comprising the step of baking the second photoresist film patterns between the step of etching the etch barrier layer and the step of coating the third photoresist film.

9. The method according to claim 8, wherein the baking step is carried out at a temperature of 150 to 300° C. for 1 to 2 minutes.

* * * * *